United States Patent
Oshinsky et al.

(10) Patent No.: US 9,342,410 B2
(45) Date of Patent: *May 17, 2016

(54) STORAGE MODULE AND METHOD FOR DETERMINING WHETHER TO BACK-UP A PREVIOUSLY-WRITTEN LOWER PAGE OF DATA BEFORE WRITING AN UPPER PAGE OF DATA

(71) Applicant: SanDisk Technologies Inc., Plano, TX (US)

(72) Inventors: Hadas Oshinsky, Kfar Saba (IL); Alon Marcu, Tel Mond (IL); Amir Shaharabany, Kochav Yair (IL)

(73) Assignee: SanDisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/333,152

(22) Filed: Jul. 16, 2014

(65) Prior Publication Data

US 2015/0301907 A1 Oct. 22, 2015

Related U.S. Application Data

(63) Continuation of application No. 14/254,377, filed on Apr. 16, 2014, now Pat. No. 8,819,337.

(51) Int. Cl.
*G06F 12/00* (2006.01)
*G06F 11/14* (2006.01)
(Continued)

(52) U.S. Cl.
CPC ........ *G06F 11/1469* (2013.01); *G06F 11/1441* (2013.01); *G06F 12/0246* (2013.01); *G06F 12/0833* (2013.01); *G11C 11/5628* (2013.01); *G11C 16/105* (2013.01); *G06F 11/1402* (2013.01); *G06F 12/0808* (2013.01); *G06F 2201/84* (2013.01); *G06F 2212/62* (2013.01); *G06F 2212/7201* (2013.01)

(58) Field of Classification Search
CPC ............ G06F 12/0246; G06F 12/0808; G06F 11/1402; G11C 11/5628; G11C 16/105
USPC ......................................... 711/103
See application file for complete search history.

(56) References Cited

U.S. PATENT DOCUMENTS

| | | | |
|---|---|---|---|
| 6,405,278 B1 * | 6/2002 | Liepe | 711/103 |
| 6,988,175 B2 | 1/2006 | Lasser | |
| 7,719,890 B2 | 5/2010 | Gorobets et al. | |
| 8,187,936 B2 | 5/2012 | Alsmeier et al. | |
| 8,234,466 B2 * | 7/2012 | Yeh | 711/162 |

(Continued)

OTHER PUBLICATIONS

Application as Filed for U.S. Appl. No. 14/133,979, filed Dec. 19, 2013, 121 pages.

(Continued)

*Primary Examiner* — Mark Giardino, Jr.
(74) *Attorney, Agent, or Firm* — Brinks Gilson & Lione

(57) ABSTRACT

A storage module and method are disclosed for determining whether to back-up a previously-written lower page of data before writing an upper page of data. In one embodiment, a storage module receives a command to write an upper page of data to memory cells that have already been programmed with a lower page of data. The storage module determines whether a command to protect the lower page of data was previously received. The storage module backs-up the lower page of data in another area of the memory before writing the upper page of data to the memory cells only if it is determined that the command to protect the lower page of data was previously received. The storage module then writes the upper page of data to the memory cells.

14 Claims, 5 Drawing Sheets

(51) Int. Cl.
*G11C 11/56* (2006.01)
*G11C 16/10* (2006.01)
*G06F 12/02* (2006.01)
*G06F 13/00* (2006.01)
*G06F 13/28* (2006.01)
*G06F 12/08* (2016.01)

(56) References Cited

U.S. PATENT DOCUMENTS

| | | | |
|---|---|---|---|
| 8,248,850 B2 | 8/2012 | Dutta et al. | |
| 8,738,974 B2* | 5/2014 | Honda | 714/53 |
| 2006/0259718 A1* | 11/2006 | Paley | 711/159 |
| 2013/0173848 A1* | 7/2013 | Lassa | G06F 3/0619 |
| | | | 711/103 |

OTHER PUBLICATIONS

Application as Filed for U.S. Appl. No. 14/136,103, filed Dec. 20, 2013, 56 pages.

Arya, P., "A Survey of 3D Nand Flash Memory", *EECS Int'l Graduate Program, National Chiao Tung University*, 2012, pp. 1-11.

Nowak, E. et al., "Intrinsic Fluctuations in Vertical NAND Flash Memories", *2012 Symposium on VLSI Technology Digest of Technical Papers*, 2012, pp. 21-22.

U.S. Appl. No. 14/133,979, filed Dec. 19, 2013, 121 pages.

U.S. Appl. No. 14/136,103, filed Dec. 20, 2013, 56 pages.

Jang et al., "Vertical Cell Array using TCAT(Terabit Cell Array Transistor) Technology for Ultra High Density NAND Flash Memory," *2009 Symposium on VLSI Technology Digest of Technical Papers*, pp. 192-193, 2009.

"ext3", printed from the internet at http://en.wikipedia.org/wiki/Ext3, dated Jan. 21, 2014, 8 pages.

"Journal file system", printed from the internet at http://en.wikipedia.org/wiki/File_system_journaling, dated Jan. 21, 2014 4 pages.

Jedec Standard, Embedded Multimedia Card (eMMC), Electric Standard 4.51, Jun. 2012.

* cited by examiner

STORAGE MODULE AND METHOD FOR DETERMINING WHETHER TO BACK-UP A PREVIOUSLY-WRITTEN LOWER PAGE OF DATA BEFORE WRITING AN UPPER PAGE OF DATA

CROSS-REFERENCE TO RELATED APPLICATION

This application is a continuation of U.S. patent application Ser. No. 14/254,377, filed Apr. 16, 2014, which is hereby incorporated by reference herein.

BACKGROUND

In storage modules with memory cells that can store more than one bit per cell, a lower page of data is first written in the memory cells, and then later, an upper page of data is written in the memory cells. In the process of writing the upper page of data in the memory cells, the previously-written values in the memory cells for the lower page are changed. So, if a power loss occurs during upper-page programming, the lower page of data may be lost because the upper-page programming of the cells corrupts the lower-page values previously stored in the cells. To guard against this possibility, the lower page of data can be backed up to another area of the memory (sometimes referred to as a "safe zone") before the upper page is written. That way, if there is a power loss when writing the upper page, the lower page can be restored from the backup. While backing-up a previously-written lower page protects against data loss if there is a power loss, backing up lower pages every time an upper page is written can reduce the performance of the storage module and provide excessive wear to the memory cells.

OVERVIEW

Embodiments of the present invention are defined by the claims, and nothing in this section should be taken as a limitation on those claims.

By way of introduction, the below embodiments relate to a storage module and method for determining whether to back-up a previously-written lower page of data before writing an upper page of data. In one embodiment, a storage module receives a command to write an upper page of data to memory cells that have already been programmed with a lower page of data. The storage module determines whether a command to protect the lower page of data was previously received. The storage module backs-up the lower page of data in another area of the memory before writing the upper page of data to the memory cells only if it is determined that the command to protect the lower page of data was previously received. The storage module then writes the upper page of data to the memory cells.

In another embodiment, a storage module receives a command to write an upper page of data to memory cells that have already been written with a lower page of data. The storage module then compares a location of a next write pointer with a location of a flush pointer on a snapshot of a data structure that was taken after a flush cache command was performed, wherein the data structure contains a list of blocks in the memory and a list of pointers to specific pages within these blocks where there is open space. The storage module determines whether a location of the lower page of data is prior to the location of the flush pointer based on the comparison of the location of next write pointer with the location of the flush pointer, wherein the location of the lower page of data is determined based on an offset from the location of the next write pointer. The storage module then backs-up the lower page of data in another area of the memory before writing the upper page of data only if it is determined that the location of the lower page of data is prior to the location of the flush pointer. The storage module then writes the upper page of data to the memory cells.

Other embodiments are possible, and each of the embodiments can be used alone or together in combination. Accordingly, various embodiments will now be described with reference to the attached drawings.

DETAILED DESCRIPTION OF THE PRESENTLY PREFERRED EMBODIMENTS

As mentioned in the background section above, backing up lower pages every time an upper page is written can protect against data loss if there is a power loss; however, it can also reduce the performance of the storage module and provide excessive wear to the memory cells. To address this problem, the following embodiments can be used to determine whether or not to back-up a previously-written lower page of data before writing an upper page of data. In one embodiment, the storage module backs-up a previously-written lower page only if it is determined that a command to protect the lower page was previously received. Such selective backing up of lower pages can improve the performance of the storage module and reduce excessive wear to the memory cells.

Before turning to these and other embodiments, the following paragraphs provide a discussion of an exemplary storage module that can be used with these embodiments. Of course, these are just examples, and other suitable types of storage modules can be used.

Figure 1:
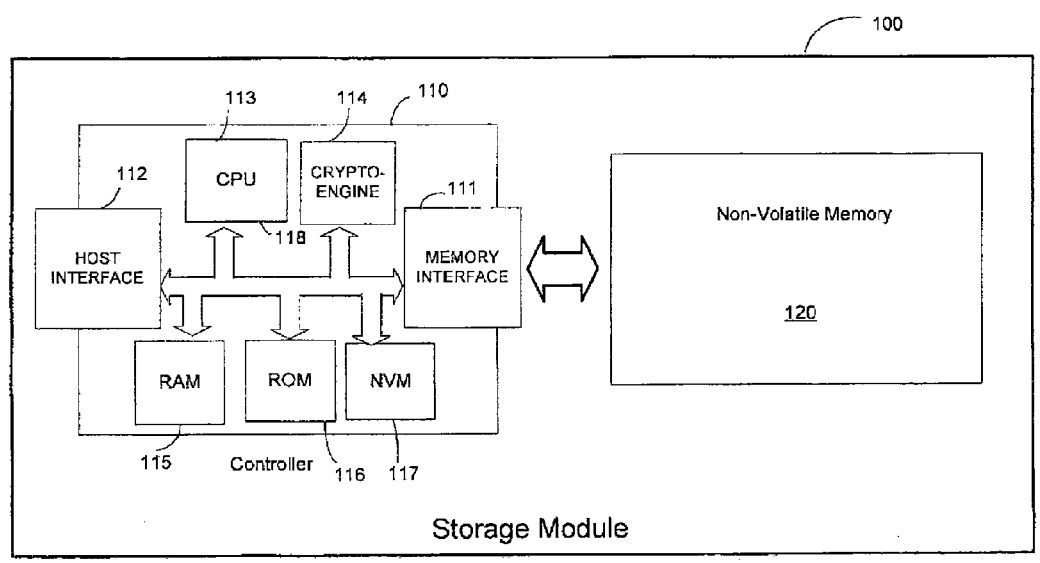
FIG. 1 is a block diagram of an exemplary storage module of an embodiment.

As illustrated in FIG. 1, a storage module 100 of one embodiment comprises a storage controller 110 and non-volatile memory 120. The storage controller 110 comprises a memory interface 111 for interfacing with the non-volatile memory 120 and a host interface 112 for placing the storage module 100 operatively in communication with a host controller. As used herein, the phrase "operatively in communication with" could mean directly in communication with or indirectly in (wired or wireless) communication with through one or more components, which may or may not be shown or described herein.

Figure 2A:
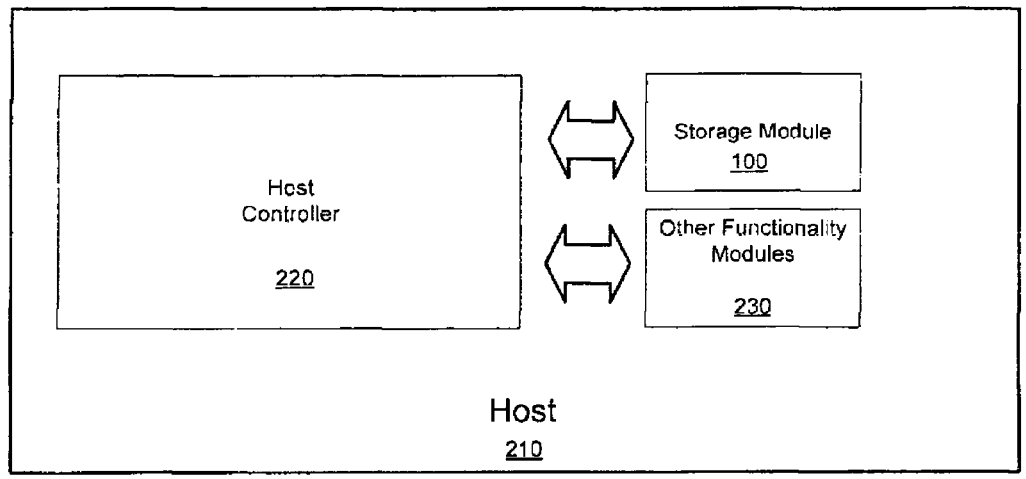
FIG. 2A is a block diagram of a host of an embodiment, where the exemplary storage module of FIG. 1 is embedded in the host.

As shown in FIG. 2A, the storage module 100 can be embedded in a host 210 having a host controller 220. That is, the host 210 embodies the host controller 220 and the storage module 100, such that the host controller 220 interfaces with the embedded storage module 100 to manage its operations. For example, the storage module 100 can take the form of an iNAND™ eSD/eMMC embedded flash drive by SanDisk Corporation, or, more generally, any type of solid state drive (SSD), a hybrid storage device (having both a hard disk drive and a solid state drive), and a memory caching system. The host controller 220 can interface with the embedded storage module 100 using, for example, an eMMC host interface or a UFS interface. The host 210 can take any form, such as, but not limited to, a mobile phone, a tablet computer, a digital media player, a game device, a personal digital assistant (PDA), a mobile (e.g., notebook, laptop) personal computer (PC), or a book reader. As shown in FIG. 2A, the host 210 can include optional other functionality modules 230. For example, if the host 210 is a mobile phone, the other functionality modules 230 can include hardware and/or software components to make and place telephone calls. As another example, if the host 210 has network connectivity capabilities, the other functionality modules 230 can include a network interface. Of course, these are just some examples, and other implementations can be used. Also, the host 210 can include other components (e.g., an audio output, input-output ports, etc.) that are not shown in FIG. 2A to simplify the drawing. It should be noted that while the host controller 220 can control the storage module 100, the storage module 100 can have its own controller to control its internal memory operations.

Figure 2B:
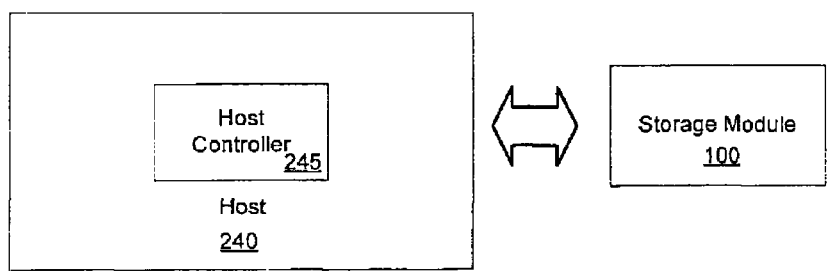
FIG. 2B is a block diagram of the exemplary storage module of FIG. 1 removably connected to a host, where the storage module and host are separable, removable devices.

As shown in FIG. 2B, instead of being an embedded device in a host, the storage module 100 can have physical and electrical connectors that allow the storage module 100 to be removably connected to a host 240 (having a host controller 245) via mating connectors. As such, the storage module 100 is a separate device from (and is not embedded in) the host 240. In this example, the storage module 100 can be a handheld, removable memory device, such as a Secure Digital (SD) memory card, a microSD memory card, a Compact Flash (CF) memory card, or a universal serial bus (USB) device (with a USB interface to the host), and the host 240 is a separate device, such as a mobile phone, a tablet computer, a digital media player, a game device, a personal digital assistant (PDA), a mobile (e.g., notebook, laptop) personal computer (PC), or a book reader, for example.

In FIGS. 2A and 2B, the storage module 100 is in communication with a host controller 220 or host 240 via the host interface 112 shown in FIG. 1. The host interface 112 can take any suitable form, such as, but not limited to, an eMMC host interface, a UFS interface, and a USB interface. The host interface 110 in the storage module 110 conveys memory management commands from the host controller 220 (FIG. 2A) or host 240 (FIG. 2B) to the storage controller 110, and also conveys memory responses from the storage controller 110 to the host controller 220 (FIG. 2A) or host 240 (FIG. 2B). Also, it should be noted that when the storage module 110 is embedded in the host 210, some or all of the functions described herein as being performed by the storage controller 110 in the storage module 100 can instead be performed by the host controller 220.

Returning to FIG. 1, the storage controller 110 comprises a central processing unit (CPU) 113, an optional hardware crypto-engine 114 operative to provide encryption and/or decryption operations, read access memory (RAM) 215, read only memory (ROM) 116 which can store firmware for the basic operations of the storage module 100, and a non-volatile memory (NVM) 117 which can store a device-specific key used for encryption/decryption operations, when used. The storage controller 110 can be implemented in any suitable manner. For example, the storage controller 110 can take the form of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example. Suitable controllers can be obtained from SanDisk or other vendors. The storage controller 110 can be configured with hardware and/or software to perform the various functions described below and shown in the flow charts. Also, some of the components shown as being internal to the storage controller 110 can also be stored external to the storage controller 110, and other component can be used. For example, the RAM 115 (or an additional RAM unit) can be located outside of the controller die and used as a page buffer for data read from and/or to be written to the memory 120.

The non-volatile memory 120 can also take any suitable form. For example, in one embodiment, the non-volatile memory 120 takes the form of a solid-state (e.g., flash) memory and can be one-time programmable, few-time programmable, or many-time programmable. The non-volatile memory 120 can also use single-level cell (SLC), multiple-level cell (MLC), triple-level cell (TLC), or other memory technologies, now known or later developed. Also, the non-volatile memory 120 can be a two-dimensional memory or a three-dimensional memory.

As mentioned above, in storage modules with memory cells that can store more than one bit per cell, a lower page of data is first written into the cells, and then later, an upper page of data is written to the cells. The new programming of the cells corrupts the lower-page values previously stored in the cells, so if a power loss occurs during this programming, the lower page of data may be lost. To guard against this possibility, the lower page of data can be backed up to another area of the memory (sometimes referred to as a "safe zone") before the upper page is written. That way, if there is a power loss when writing the upper page, the lower page can be restored from the backup. However, while backing-up a previously-written lower page protects against data loss if there is a power loss, backing up lower pages every time an upper page is written can reduce the performance of the storage module and provide excessive wear to the memory cells.

Figure 3:
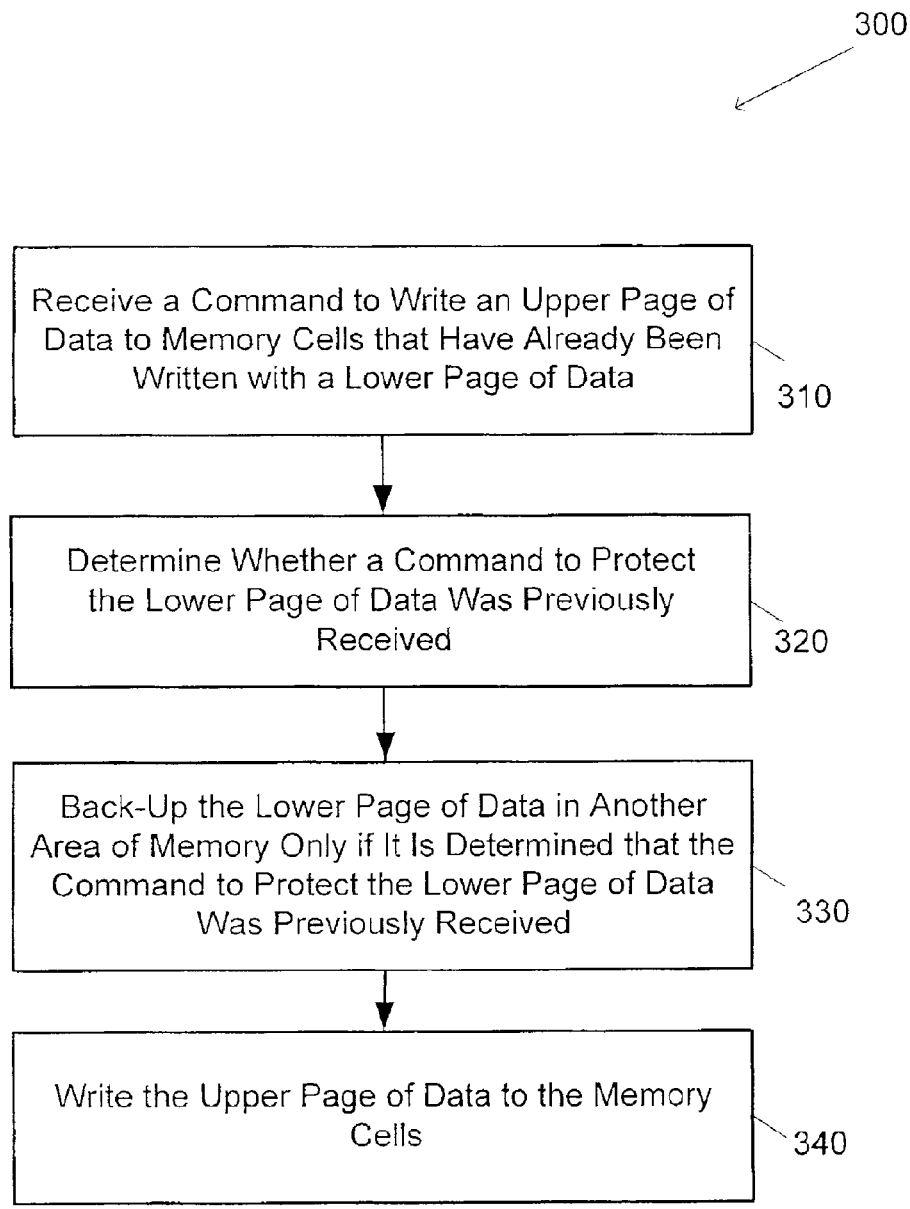
FIG. 3 is a flow chart of a method of an embodiment for determining whether to back-up a previously-written lower page of data before writing an upper page of data.
Figure 4:
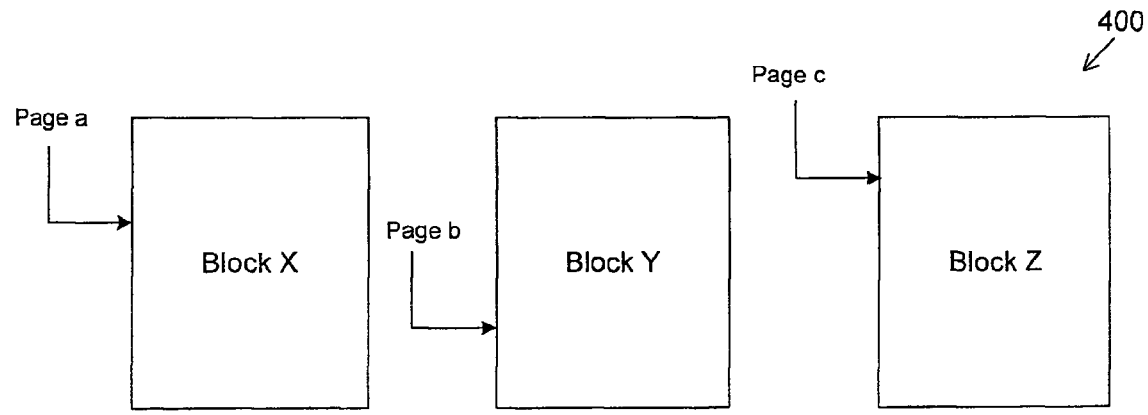
FIG. 4 is an illustration of a data structure of an embodiment.

To address this problem, the following embodiments can be used to determine whether or not to back-up a previously-written lower page of data before writing an upper page of data. This embodiment will be discussed in more detail in conjunction with the flow chart 300 in FIG. 3. As shown in FIG. 3, the storage module 100 receive a command (e.g., from the host controller) to write an upper page of data to memory cells that have already been written with a lower page of data (act 310). The storage module 100 then determines whether a command to protect the lower page of data was previously received (e.g., from the host controller) by the storage module 100 (act 320). The lower page of data would be protected by backing it up in another area of memory (a "safe zone"), so that, if a power loss occurs when writing the upper page of data, the lower page of data is "protected" because the back-up can be used to restore the data that was corrupted due to the power loss. The storage module 100 then backs-up the lower page of data in another area of the memory only if it is determined that the command to protect the lower page of data was previously received (act 330). (In one embodiment, the "safe zone" in which the back-up is stored is a single-level cell (SLC) partition in the memory 120. SLC cells can provide more accurate storage than multi-level cells, and better accuracy may be desired when storing a back-up of data that is supposed to be protected.) The storage module 100 then writes the upper page of data to the memory cells (act 340).

In this embodiment, the selective backing up of a lower page is based on whether a command to protect the lower page was previously received by the storage module 100. Because not every lower page is backed up, the selective backing up of lower pages provided by this embodiment can improve the performance of the storage module 100 and reduce excessive wear to the memory cells.

A command to protect the lower page can take any suitable form, and, in one embodiment, takes the form of a "flush cache" command specified in the embedded MultiMediaCard (eMMC) 4.X standard. By way of background, the storage module's RAM 115 can be used as a cache to hold incoming data from a host controller before it is written into the non-volatile memory 120. Once the storage module 100 stores the data in the RAM 115, it confirms the storage of the data by releasing a busy signal with the host controller, even though the data has not yet been written to the non-volatile memory 120. Accordingly, if there is a power loss, the data stored in the RAM 115 will be lost. For certain data, such as file system and other important data, the host controller wants to ensure the data is actually written to the non-volatile memory 120 and also that such data will be protected against power-loss corruption during upper-page programming. The "flush cache" command accomplishes this because, in response to receiving the "flush cache" command, the storage module 100 programs the data stored in the RAM 115 into the non-volatile memory 120. Also, according to the standard, the storage module 100 needs to protect only the data received before the "flush cache" command. Data written after the "flush cache" command does not need to be guaranteed, as the storage module 100 can merely revert to whatever data was stored in the memory 120 at of the time of the last flush command.

This embodiment recognizes that, since only the data received before the "flush cache" command needs to be protected from a power-failure loss, when the "flush cache" command is received can be used as a marker against which to determine when subsequent upper-page write commands will trigger the need to back-up lower page data into a safe zone. FIGS. 4-7 will be used to describe one particular implementation of this embodiment. Of course, this is just one example, and other implementations can be used.

In this implementation, the storage module 100 uses a data structure 400 (see FIG. 4) that contains a list of blocks in the memory 120, and a list of pointers to specific pages within these blocks where there is open space. So, when a "flush cache" command is received, these pointers indicate the boundary between data that needs to be protected (i.e., the pages above the pointer) and data that does not need to be protected (i.e., the pages below the pointer). However, as future writes are performed, these pointers are moved to reflect what is then the current location of open blocks, but the new location of the pointers does not necessarily reflect where the protection boundary is anymore. So, in this embodiment, at the end of a flush command after all host data is written to the memory 120, the storage module 100 takes a snapshot of this data structure 400 and stores it in RAM 115 (or in another location in the storage module 100). By taking a snapshot, the storage module 100 will know where the "flush cache" boundary is, even after the pointers in the underlying data structure are moved in response to subsequent writes.

Figure 6:
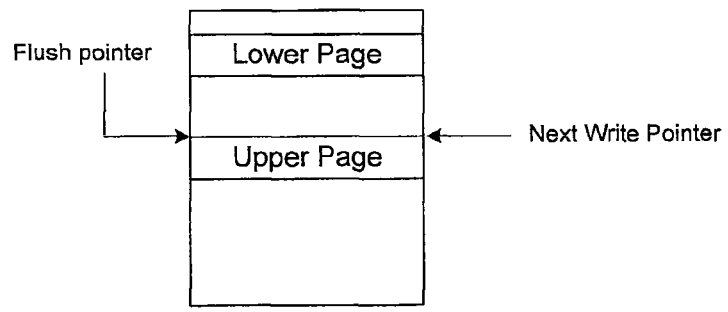
FIG. 6 is an illustration of an embodiment in which a previously-written lower page of data should be backed-up before writing an upper page of data.
Figure 7:
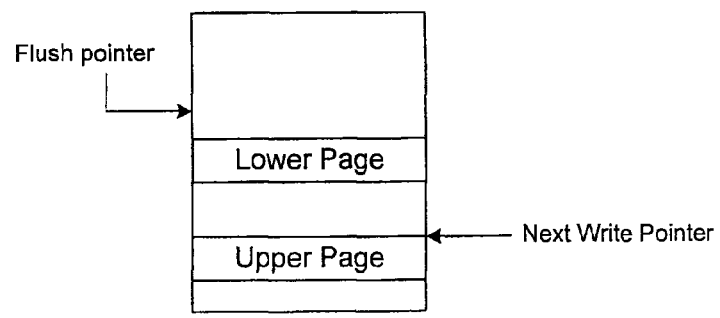
FIG. 7 is an illustration of an embodiment in which a previously-written lower page of data should not be backed-up before writing an upper page of data.
Figure 5:
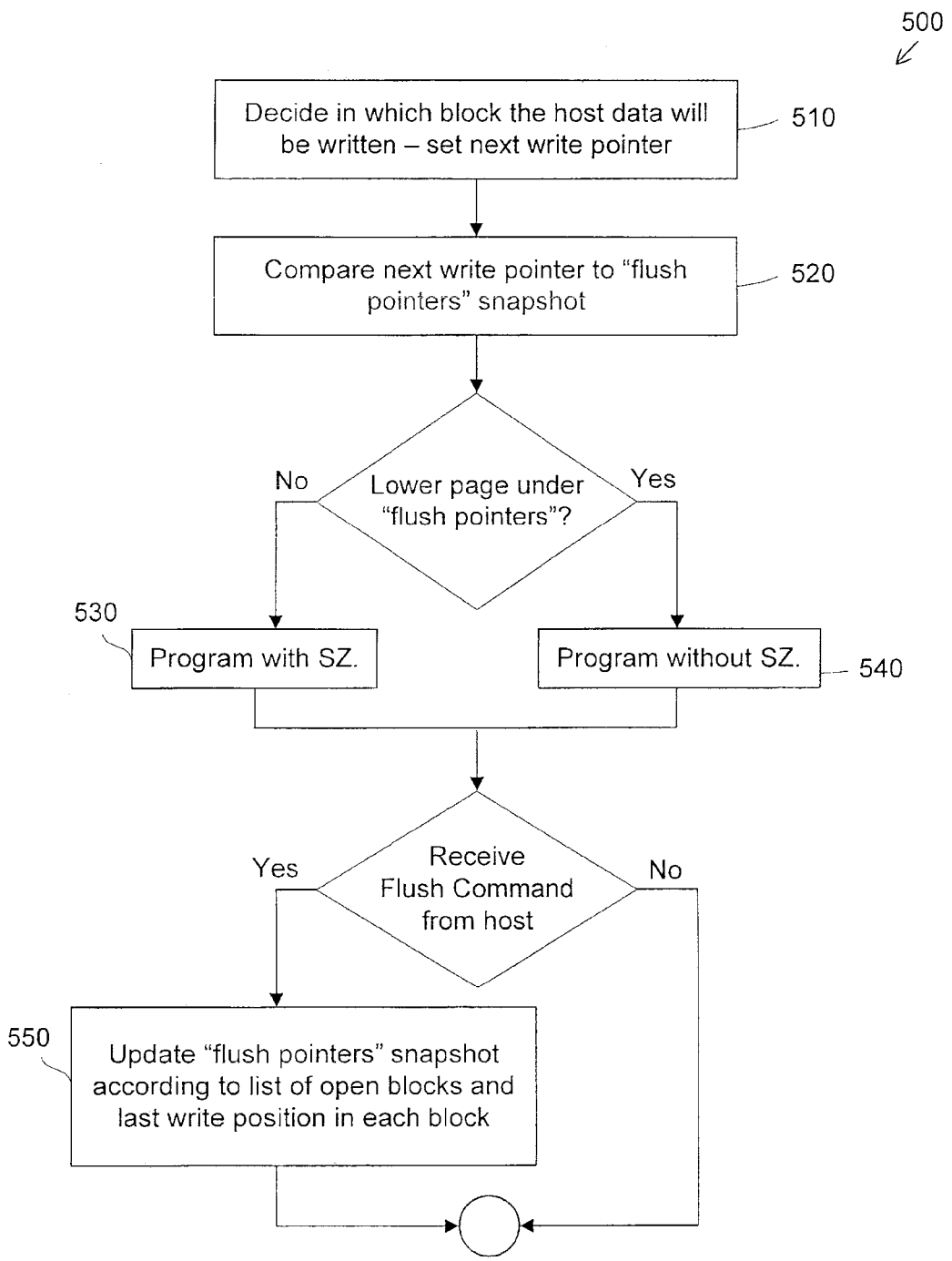
FIG. 5 is a flow chart of another method of an embodiment for determining whether to back-up a previously-written lower page of data before writing an upper page of data.

The flow chart 500 of FIG. 5 and the examples shown in FIG. 6-7 illustrate the operation of this method. In general, in this example, the decision of whether to back-up lower page data is made by comparing the next write pointer with the addresses of the pointers in "flush pointers" snapshot. If the next write pointer can hurt a lower page below one of the flush pointers, according to some predefined metric, then the lower page is at risk and is copied to a safe zone before upper page programming. If, however, the next write pointer is far enough from the flush pointers to not risk a previously-programmed lower page (according to some predefined metric), then the lower page is not copied to a safe zone. For example, the location of the lower page of data can be determined based on a mapping or an offset from the location of the next write pointer (e.g., the lower page is two pages prior to the upper page). So, the storage module 100 can determine whether a location of the lower page of data is prior to the location of the flush pointer (and thus needs protecting) based on the comparison of the location of next write pointer with the location of the flush pointer (because the location of the lower page of data can be determined based on an offset from the location of the next write pointer). The storage module 100 can then back-up the lower page of data in another area of the memory before writing the upper page of data only if it is determined that the location of the lower page of data is prior to the location of the flush pointer.

Turning now to FIG. 5, when the storage module 100 receives data from the host, the storage module 100 first decides in which block the data will be written and sets the write pointer in the data structure snapshot (act 510). By doing this, the storage module 100 can compare the location of the write pointer with the flush pointer to see if the write pointer is under the flush pointer (act 520). For example, FIG. 6 shows the next write pointer being at the same location as the flush pointer (meaning that the lower page is above the flush pointer), whereas FIG. 7 shows the next write pointer under the flush pointer. Power loss corruption has to be guarded against in FIG. 6 because the lower page that is at risk is above the flush pointer, meaning that the lower page was sent to the storage module 100 before the "flush cache" command was received. So, in the example in FIG. 6, the lower page is to be backed up in a safe zone ("SZ") before the upper page is written (act 530). In contrast, the lower page in FIG. 7 was written after the "flush cache" command was received and the offset between the upper page and lower page indicates that the lower page is located after the flush pointer. So, the lower page does not need to be protected. Accordingly, the upper page can be protected without backing up the lower page to a safe zone (act 540). In either case, as subsequent "flush cache" commands are received, the snapshot is updated (act 550).

There are many alternatives that can be used with these embodiments. For example, although a particular data structure was discussed above to determine whether or not to back-up lower page data in a safe zone, other types of data structures, as well as methods that do not involve data structures, can be used to minimize the amount of safe zone protection used, so that only some previously-programmed lower pages are backed up. Also, commands other than the eMMC "flush cache" command can be used to protect previously-written data. For example, a weak flush (barrier) command can be used, in which the lower pages that were programmed and confirmed at the last barrier command are backed-up, but lower pages that were not confirmed are not backed up. Also, while the flush command triggers the storage module 100 to both take an action (flush the cache) and dictate what data is to be protected, other commands can simply dictate what data is to be protected (without triggering another action by the storage module 100). So, the claims should not be read as requiring a specific way of determining whether or not to back-up lower page data in a safe zone or a specific type of command unless expressly recited therein. Also, while the above examples related to storing two bits per memory cell, these embodiments can be used with memory cells that store more than two bits per cell. Accordingly, the terms "lower page" and "upper page" are merely relative terms that apply to any multi-level memory cell and do not imply that the memory cell only stores two bits.

Also, as mentioned above, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method for determining whether to back-up a previously-written lower page of data before writing an upper page of data, the method comprising:
   performing the following in a storage module having a memory with a plurality of memory cells:
      receiving a command to write an upper page of data to memory cells that have already been written with a lower page of data;
      determining whether a command to protect the lower page of data was previously received;
      backing-up the lower page of data in another area of the memory before writing the upper page of data only if it is determined that a command to protect the lower page of data was previously received; and
      writing the upper page of data to the memory cells;
   wherein the command is a "flush cache" command; and
   wherein determining whether the command to protect the lower page of data was previously received is performed by comparing a location of a next write pointer with a location of a flush pointer on a snapshot of a data structure that was taken after the "flush cache" command was performed, wherein the data structure contains a list of blocks in the memory and a list of pointers to specific pages within these blocks where there is open space.

2. The method of claim 1, wherein the lower page of data is backed-up in single-level cells in the memory.

3. The method of claim 1 further comprising:
   in response to determining that a power failure occurred while writing the upper page of data, restoring the lower page of data from the backed-up version of the lower page of data.

4. The method of claim 1, wherein the memory is a three-dimensional memory.

5. The method of claim 1, wherein the storage module is embedded in a host.

6. The method of claim 1, wherein the storage module is removably connected to a host.

7. The method of claim 1, wherein the storage module is a solid-state drive.

8. A storage module comprising:
   a memory having a plurality of memory cells; and
   a controller in communication with the memory, wherein the controller is configured to:
      receive a command to write an upper page of data to memory cells that have already been written with a lower page of data;
      determine whether a command to protect the lower page of data was previously received;
      back-up the lower page of data in another area of the memory before writing the upper page of data only if it is determined that a command to protect the lower page of data was previously received; and
      write the upper page of data to the memory cells;
   wherein the command is a "flush cache" command; and
   wherein determining whether the command to protect the lower page of data was previously received is performed by comparing a location of a next write pointer with a location of a flush pointer on a snapshot of a data structure that was taken after the "flush cache" command was performed, wherein the data structure contains a list of blocks in the memory and a list of pointers to specific pages within these blocks where there is open space.

9. The storage module of claim 8, wherein the lower page of data is backed-up in single-level cells in the memory.

10. The storage module of claim 8, wherein the controller is further configured to:
   in response to determining that a power failure occurred while writing the upper page of data, restore the lower page of data from the backed-up version of the lower page of data.

11. The storage module of claim 8, wherein the memory is a three-dimensional memory.

12. The storage module of claim 8, wherein the storage module is embedded in a host.

13. The storage module of claim 8, wherein the storage module is removably connected to a host.

14. The storage module of claim 8, wherein the storage module is a solid-state drive.

* * * * *